(12) United States Patent
Hilgers

(10) Patent No.: US 8,729,454 B2
(45) Date of Patent: May 20, 2014

(54) SOLID-STATE LIGHT SOURCE WITH COLOR FEEDBACK AND COMBINED COMMUNICATION MEANS

(75) Inventor: Achim Hilgers, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 448 days.

(21) Appl. No.: 12/439,798

(22) PCT Filed: Sep. 18, 2007

(86) PCT No.: PCT/IB2007/053761
§ 371 (c)(1),
(2), (4) Date: Mar. 3, 2009

(87) PCT Pub. No.: WO2008/038181
PCT Pub. Date: Apr. 3, 2008

(65) Prior Publication Data
US 2009/0321666 A1   Dec. 31, 2009

(30) Foreign Application Priority Data
Sep. 28, 2006   (EP) .................... 06121460

(51) Int. Cl.
*H01J 5/16* (2006.01)
*H01J 5/02* (2006.01)

(52) U.S. Cl.
USPC .......................................... 250/226; 250/239

(58) Field of Classification Search
USPC ............ 250/214 R, 214.1, 221, 214 VT, 226, 250/206, 216, 552, 214 AL, 214 A, 551, 250/205, 239, 338.1, 338.4, 339.02, 339.05, 250/339.06, 393; 340/600, 540; 315/155, 315/151, 169.3, 152; 362/276, 362, 800; 313/524, 110, 111, 498, 500
See application file for complete search history.

(56) References Cited

U.S. PATENT DOCUMENTS

| | | | | |
|---|---|---|---|---|
| 5,581,094 | A * | 12/1996 | Hara et al. | 257/80 |
| 5,701,187 | A * | 12/1997 | Uchio et al. | 398/212 |
| 5,703,363 | A | 12/1997 | Hayes | |
| 5,801,373 | A * | 9/1998 | Oozu et al. | 250/208.1 |
| 6,266,211 | B1 * | 7/2001 | Thomas et al. | 360/133 |
| 6,271,831 | B1 * | 8/2001 | Escobosa et al. | 345/158 |
| 6,940,590 | B2 * | 9/2005 | Colvin et al. | 356/218 |

(Continued)

FOREIGN PATENT DOCUMENTS

| | | | | |
|---|---|---|---|---|
| EP | 0809298 A1 | 11/1997 | | |
| JP | 2001238206 A * | 8/2001 | | H04N 7/18 |
| JP | 2002022652 A | 1/2002 | | |
| WO | 0037904 A1 | 6/2000 | | |

*Primary Examiner* — Que T Le
*Assistant Examiner* — Jennifer Bennett
(74) *Attorney, Agent, or Firm* — Mark L. Beloborodov; John F. Salazar

(57) ABSTRACT

The present invention relates to a light sensor device comprising a substrate (18), a first light sensitive area (14, 15), and a second light sensitive area (12, 13). It is characterized in that a first optical filter device (22) assigned to said first area (14) and adapted to filter the visible light spectrum and a second optical filter device (24) assigned to said second area (12) and adapted to filter the non-visible light spectrum, preferably IR light spectrum, are provided, and said first and second light sensitive areas (12, 14) are fabricated on the same substrate (18) adjacent to each other to form a single integrated sensor component (10). The invention also relates to a lamp device (60) comprising such a light sensor device.

8 Claims, 3 Drawing Sheets

(56) References Cited

U.S. PATENT DOCUMENTS

| | | | |
|---|---|---|---|
| 7,521,667 B2* | 4/2009 | Rains et al. | 250/228 |
| 7,583,901 B2* | 9/2009 | Nakagawa et al. | 398/183 |
| 7,729,569 B2* | 6/2010 | Beer et al. | 385/14 |
| 2004/0105264 A1 | 6/2004 | Spero | |
| 2005/0047794 A1* | 3/2005 | Quintanar | 398/149 |
| 2005/0179404 A1 | 8/2005 | Veskovic et al. | |
| 2006/0018118 A1* | 1/2006 | Lee et al. | 362/231 |
| 2006/0020216 A1* | 1/2006 | Oishi et al. | 600/500 |
| 2006/0092407 A1 | 5/2006 | Tan et al. | |
| 2006/0124833 A1 | 6/2006 | Toda | |

* cited by examiner

SOLID-STATE LIGHT SOURCE WITH COLOR FEEDBACK AND COMBINED COMMUNICATION MEANS

This application is a national stage application under 35 U.S.C. §371 of International Application No. PCT/IB2007/053761 filed on Sep. 18, 2007, and published in the English language on Mar. 4, 2008 as International Publication No. WO/2008/038181, which claims priority to European Application No. 06121460.7, filed on Sep. 28, 2006, incorporated herein by reference.

The present invention relates to a light sensor device comprising a substrate, a first light sensitive area and a second light sensitive area. The invention further relates to a lamp device comprising such a light sensor device.

Lighting sources are going to change in such a manner that conventional lighting devices (for example signal lights, lamps, etc.) and systems are more and more equipped with light emitting diode-based light sources. The main advantages of these LED light sources are the higher efficiency and their increased lifetime. Because of the very small LED dimensions and their flexible form factors, novel and interesting opportunities are offered to lamp designers.

The original applications of LEDs, as for example small signal lights, have been expanded very much. Very often combinations of multiple LEDs (connected in series and/or parallel) are used to increase the light output and hence to realize physically bigger high brightness lighting devices as for example traffic lights. Also in the automotive area, LED-based lighting devices are implemented increasingly. Currently they can be found as backup light, break light and in flashing light systems. First trials to use them as headlights have been made and the results are looking promising.

In addition, a typical market for LED-based light sources will be in the field of professional lighting as well as in the area of consumer applications (for example atmosphere lighting at home). Especially in these applications, higher requirements to the light sources are made. In particular, a very good color quality (for example color rendering) is necessary to fulfill the requirements. Further it would be of additional interest to adapt the color itself (and/or the color temperature) of such an LED light source to the user demanding. All this requires very specialized and adapted electronic driving circuitries for the LED light sources.

Usually white light is generated by means of a combination of a few different LEDs (with different colors). In principle, the mix of these different colors is used to generate the wanted white light (or also every other color) with the demanded characteristic. Very often red (R), green (G) and blue (B) LEDs are used. More colors, as for example amber (A), could be added to improve the color quality. In principle, other color combinations can be used as well. By means of such combinations, the light output (luminous flux) and the color temperature of the white light can be adjusted. But also other colors could be generated (for example orange), if only special combinations of LEDs with different electronic driving signals are used.

However, these possibilities require very specialized electronic driving circuits for each (or combinations) of the LEDs of such light sources. In addition, a sensor-based feedback loop (control) may be implemented in order to measure the light characteristic and to steer the light output towards the desired one. As sensors, conventional photo sensitive devices such as light sensors (measuring the luminous flux) or (true) color sensors (measuring the light spectrum) can be used. They may be added by means of temperature sensing devices or others. All sensed data will be used to feed the control circuitry of the lighting device, which will adjust the driving currents of the LEDs independently, unless the required light characteristic has been reached. The electronic driving currents of the LEDs can be modified in a vast variety of basic circuits, which are state of the art. Exemplarily, pulse width modulation (PWM), amplitude modulation (AM) as well as direct current feeding is to be mentioned.

In addition, there will be a demand to establish a communication link between a light source and a control device or even between different light sources within one area, such as, for example, a room. This would allow for cordlessly control of a light source (intensity but also color) or would allow for adjustments (intensity or color) between several light sources.

A light sensor device as mentioned above is, for example, disclosed in US 2004/0105264 A1. The light sensor device according to this document employs photo-detectors with specific spectral sensitivity to detect a specific color. The measurement of the sensor is then used to control the light radiating elements, like LEDs.

Document US 2006/0092407 A1 discloses a method and an apparatus for identifying a sensed light environment. Particularly, a plurality of light sensors are used to produce a sensed data set corresponding to different ranges of light and at least a portion of one of the ranges of light is outside the visible light spectrum. For each range of light, a single light sensor is provided.

The light sensor approaches known in the art have in common that they employ a plurality of sensor elements for the different light ranges, resulting in a device being complicated in terms of wiring and hence expensive and large, restricting the field of possible applications, particularly in small LED lamps. These disadvantages of prior light sensor devices become more critical if the device has to be equipped with IR sensor capability, for example to detect wirelessly transmitted control signals.

In view of the above, it is therefore an object of the present invention to provide a light sensor device which is less expensive, allows a simplified assembly and a smaller design.

This object is solved by the afore-mentioned light sensor device which comprises a first optical filter device assigned to said first area and adapted to filter the visible light spectrum, and a second optical filter device assigned to said second area and adapted to filter the non-visible light spectrum, preferably the IR light spectrum, wherein said first and second light sensitive areas are fabricated on the same substrate adjacent to each other to form a single integrated sensor component.

This means in other words, that the present invention provides for a single integrated sensor component comprising preferably identical light sensitive areas, one of which is responsive to the visible light and the other sensitive area is responsive to the non-visible light, preferably infrared light. This is achieved by the first and second filter devices, the first being adapted to filter the visible light spectrum (meaning that the visible light spectrum passes through), and the second is adapted to filter the non-visible, preferably infrared light spectrum. Since the sensor capability for visible light and non-visible, preferably infrared light is realized on the same substrate, the resulting sensor component is small and less expensive compared with solutions employing plural discrete sensor elements. Further, the resulting sensor component requires less wiring measures for coupling it with a control device of a lamp.

To sum up, the present invention allows to realize a very compact and cost-effective light sensor device equipped with the capability to also sense infrared light or ultraviolet light used for transmitting control signals. Since the light sensor device according to the present invention is a very compact unit, a lamp device incorporating the sensor device may also be designed with a small form factor.

In the context of the present invention, optical filter device means every filter type adapted to pass a certain light spectrum and to block another light spectrum. Beside optical glass filters also interference filters are e.g. employable.

In a preferred embodiment, said first and second light sensitive areas are provided within at least one window of the substrate and said first and second filter devices are arranged above said window.

This measure has the advantage that the sensitive areas are shielded against stray light which normally would not be blocked by the respective filter device. Hence, the sensing result may be improved.

In a further preferred embodiment, both light sensitive areas are sensitive to visible light as well as infrared light.

This means in other words that both sensitive areas are sensitive to the same light spectrum range and have therefore a similar structure.

The advantage of this measure is that the costs for the device may be further reduced using similar structures and similar fabrication technologies, like Si-technology.

In a further preferred embodiment, at least one of said light sensitive areas is provided as at least one PIN photodiode.

This measure has been proven advantageous in practice. It is to be noted, that a light sensitive area may comprise one or more PIN photodiodes arranged in parallel or in series. The number of PIN photodiodes and the way to couple them with each other depends on the required sensitivity of the sensor.

In a further preferred embodiment, said first area is adapted to form three sensitive regions, each region is assigned an optical filter device, said optical filter devices separating the visible light spectrum in three sub-spectra. Preferably, said optical filter devices are adapted to filter red, green and blue light.

The provision of three independent sensitive regions allows to improve the sensor quality and precision. Particularly, three optical filter devices sensitive to red, green and blue light allow to design a light sensor device which is capable of sensing the whole visible light spectrum and hence to make a precise color control of a lamp possible. This is achieved without a large and space-consuming design.

Of course, it would also be possible to use a different number of light sensitive regions and hence a different number of filter devices.

In a further preferred embodiment, at least one of said sensitive areas is coupled with at least one amplifier stage for amplifying the output of said sensitive area. Preferably, the amplifier stage is also fabricated on the same substrate.

The integration of an amplifier stage on the same substrate improves the measurement signal quality and hence the overall quality of the sensor device. Due to the fact that the amplifier stage is fabricated on the same substrate, the resulting device is still very compact and the wiring efforts are low.

In a further preferred embodiment, the output of at least one of said amplifier stages is coupled to filter means, preferably low pass filter means.

This measure has the advantage that the measurement quality of the sensor device may further be improved, since non-interesting signals above a certain frequency (cut-off frequency of the low pass filter) may be filtered out and are hence not part of the output signal any more.

In a preferred embodiment, an infrared emitting diode is provided which is disposed on the substrate and driven by a controller circuit for transmitting information and/or control signals via IR light.

This measure has the advantage that the light sensor device may also be used for transmitting information. The infrared LED is integrated on the same substrate as the light sensitive areas, so that a compact light sensor component with additional transmitting capability is achieved.

The light sensor device according to the present invention may be incorporated into a lamp device which comprises at least one light source for radiating visible light and a control circuit for controlling the color of the light source, wherein the inventive light sensor device is coupled to said control circuit for supplying information about the color of the radiated light.

It is to be noted that the light source may comprise at least one light emitting diode (LED), organic light emitting diode (OLED) or poly light emitting diode (P-LED), or any combination thereof. The present invention is not restricted to a specific kind of light source, however, the application of the inventive light sensor device in the field of LED lighting is most promising.

Further features and advantages can be taken from the following description and the enclosed drawings.

It is to be understood that the features mentioned above and those yet to be explained below can be used not only in the respective combinations indicated, but also in other combinations or in isolation, without leaving the scope of the present invention.

Embodiments of the invention are shown in the drawings and will be explained in more detail in the description below with reference to same. In the drawings.

Figure 1:
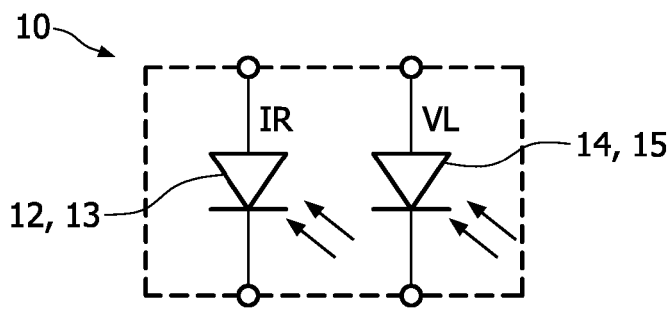
FIG. 1 shows a block diagram of an inventive light sensor device.

In FIG. 1, a block diagram of a light sensor device is shown and indicated with reference numeral 10. The light sensor device 10 comprises a first light sensor 14 and a second light sensor 12. Both light sensors are sensitive to the visible light spectrum and the infrared light spectrum. In a preferred embodiment, both light sensor elements are photodiodes, for example PIN photodiodes 13, 15.

The light sensor device 10 is adapted to detect the light intensity of the visible light spectrum and that of the infrared spectrum independently of each other. As will be described in detail below, the infrared detection capability may be used for receiving control signals which are sent by an infrared transmitter. However, it is to be understood that the light sensor may be equipped with an ultraviolet capability instead of an infrared capability for receiving control signals sent by an ultraviolet transmitter. The invention is not limited to infrared light detection.

It is to be noted that both light sensors 12, 14 are integral part of a substrate, so that a very compact light sensor device may be achieved.

Figure 2A:
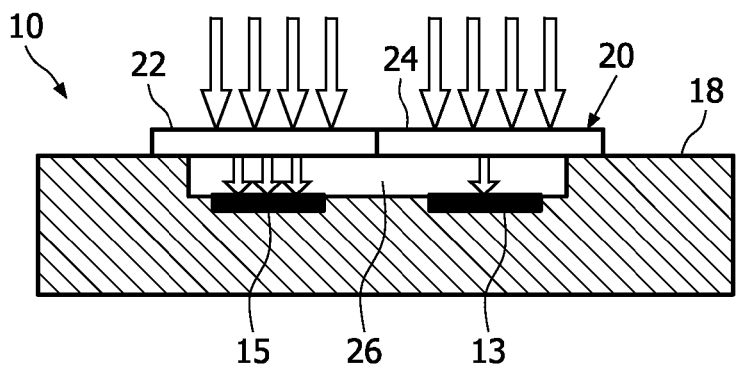
FIGS. 2A, 2B show schematic views of the structures of two different embodiments of the present invention.

The semiconductor structure of the light sensor device is schematically shown in FIG. 2A. The light sensor device 10 comprises a substrate 18 of a semiconductor material on which both light sensors 12, 14, namely photodiodes 13, 15, are fabricated, forming two light sensitive areas. Both light sensitive areas or photodiodes 13, 15 are disposed within a window 26 of the substrate 18. Above the light sensitive areas 13, 15, an optical filter device 20 is provided and covers the window 26. For fabricating the device, well known Si-technologies may be used.

In the embodiment shown in FIG. 2A, the filter device 20 comprises two filter elements 22, 24 for filtering the visible light spectrum and the infrared light spectrum, respectively. In case that an interference filter is used the respective filter elements are directly disposed on the light sensitive areas 13, 15 without forming a gap therebetween.

The first filter element 22 is assigned to the first light sensitive area 15, and the second filter element 24 is assigned to the second light sensitive area 13. Hence, only the visible light spectrum reaches the first light sensitive area 15, whereas only the infrared light spectrum reaches the second light sensitive area 13. This is indicated by the arrows in FIG. 2A. Due to the fact that two filter elements are used, both light sensitive areas 13, 15 may have the same structure, meaning that they are responsive to the same light spectrum.

Figure 2B:
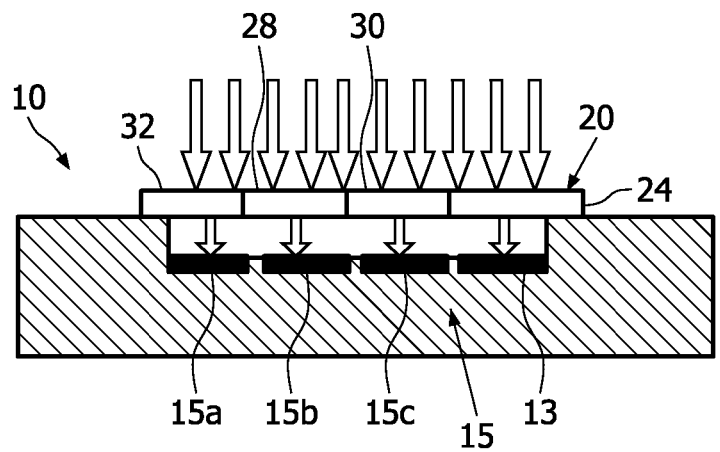

In FIG. 2B, a further embodiment of a light sensor device is schematically shown. In contrast to the embodiment described with respect to FIG. 2A, the filter device 20 comprises three different filter elements 28, 30, 32 in addition to the filter element 24 described above. Particularly, the filter element 22 for filtering the visible light spectrum is divided into three different filter elements, each filtering a predetermined portion of the visible light spectrum. It is, for example, preferred that the filter elements 28, 30, 32 are adapted to filter the red, green and blue light spectrum.

A separation, as for the filter element 22, is also carried out for the first light sensitive area 15, so that three light sensitive regions 15a, 15b, 15c are provided. Each of the light sensitive regions is assigned to one of the three filter elements 28, 30, 32.

Hence, this light sensor device allows to detect the light intensity of the red, green and blue light portion of the measured light spectrum independently.

However, it is to be noted that other filter elements for filtering different portions of the visible light spectrum may be conceivable when it is required by the application.

Figure 3:
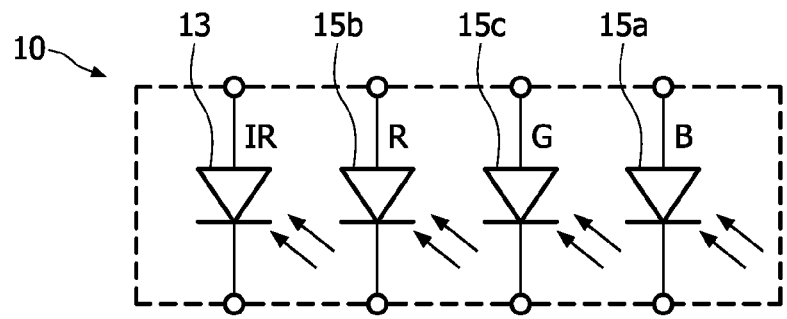
FIG. 3 shows a block diagram of a light sensor device according to a further embodiment.

The respective electrical block diagram of this light sensor device 10 is shown in FIG. 3. It is apparent that four light sensitive elements for the blue, green, red and infrared portions are provided. Since the respective light sensitive areas 15, 13 are fabricated on the same substrate 18, a very compact light sensor device which is capable of detecting three different colors using e.g. Si-technologies, and infrared is provided.

Particularly, the filter elements of the filter device 20 are selected such that their sensitivity for the visible light is separated into three different sub-sensitivities, preferably each matched to one of the three CIE color matching functions. Further, the filter element 24 is selected such that it is sensitive to the infrared portion of the light spectrum.

Again, it is to be noted that filter elements having different filter characteristics may also be possible. The selection of the structure of the filter device 20 solely depends on the desired application, particularly the desired control function to be performed on the basis of the output signal of the light sensor device 10.

Further, it is to be noted that not only photodiodes but also other photosensitive elements like phototransistors, solar cells, photoresistors, etc. could be used as light sensors 12, 14.

Figure 4:
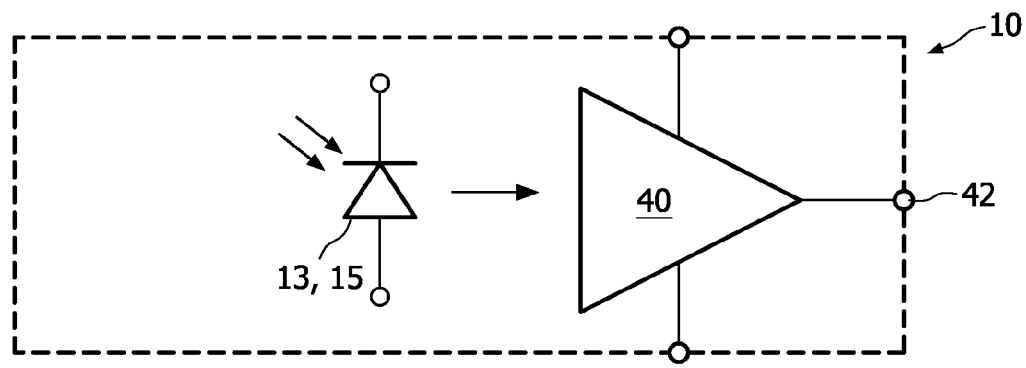
FIG. 4 shows a block diagram of a further embodiment of the present invention.

In FIG. 4, a further embodiment of the light sensor device 10 is shown. In contrast to the embodiments described above, the light sensor device 10 comprises an amplification stage 40 which is adapted to amplify the output signal of each light sensitive area 13, 15. The amplified output signal is provided at an output 42. Particularly, the amplifier stage comprises one amplifier for each light sensitive area 13, 15. However, it would also be possible that just one amplifier stage for all light sensitive areas 13, 15 may be used; then, a multiplexing procedure for the sensor signals is required.

The amplification of the amplifier stages 40 can be done by so-called transimpedance amplifiers which are well known and can be directly implemented as part of the light sensor device since the same Si-technology can be used.

It is to be noted that the amplifier stage 40 may be provided with further terminals as to define the amplification factor by coupling for example external components, such as resistors, etc.

Figure 5:
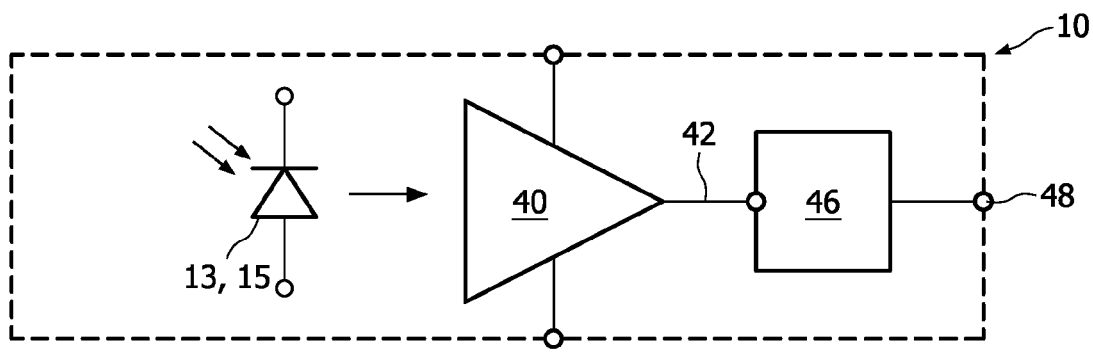
FIG. 5 shows a block diagram of a further embodiment of the present invention.

In FIG. 5, a further preferred embodiment of a light sensor device is shown and indicated with reference numeral 10. In addition to the embodiment shown in FIG. 4, the light sensor device 10 of FIG. 5 comprises a filter stage 46 for filtering the output of the amplifier stage 40. The filtered output signal is provided at an output 48. Preferably, the output of every light sensitive area is filtered by means of one corresponding filter stage 46. However, it would also be possible to multiplex the output signals of the light sensitive areas to one single filter stage.

The filtering of the filter stage 46 can be done by so-called low pass filters, which are well known and transferring only signals below the so-called cut-off frequency. In the simplest case, they consist of an RC combination. However, also passive or active filter designs can be used. Further, the filter stage may also have further terminals for coupling external components, such as resistors and/or capacitors, in order to define the filter characteristic.

Figure 6:
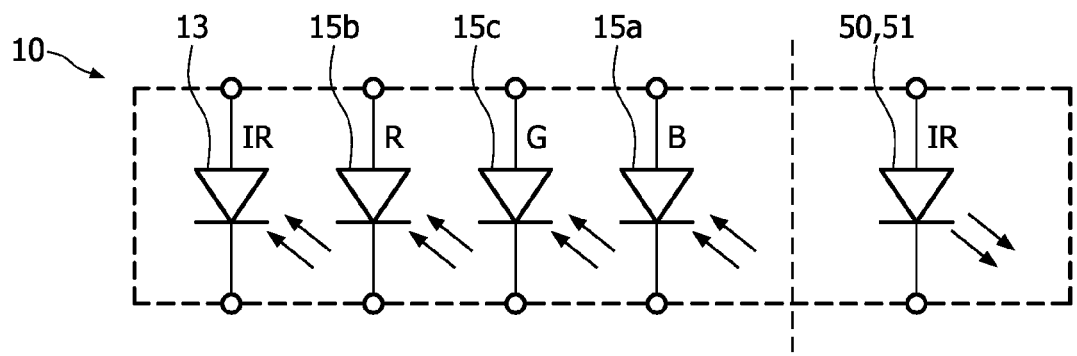
FIG. 6 shows a block diagram of a further embodiment of the present invention.

The most integrated version of a light sensor device is shown in FIG. 6. The light sensing portion of the device comprising the light sensitive areas 13 and 15 is extended by an infrared transmitting device 50. The IR transmitting device is preferably provided in form of an infrared LED 51, but also other IR-emitting devices, such as transistors, could be used. The IR transmitting device has to be constructed in such a manner that the transmitted infrared signal is decoupled from the own sensitive area 13. The cross-talk between transmitting and receiving portions of the light sensor device 10 has to be reduced. This can be done by optimized filter constructions and/or choosing adapted locations of the components.

It is to be noted that an amplifier stage may also be assigned to the infrared transmitting device 50, although this is not shown in FIG. 6. Moreover, this amplifier stage may be adjusted by connecting external components to the respective terminals, as already discussed with respect to the amplifier stages 40 shown in FIG. 4.

Further, it is to be noted that the light sensitive areas 13, 15 as well as the infrared transmitting device 50 of the light sensor device shown in FIG. 6 are all integrated in a common substrate so that a very compact device may be provided.

Figure 7:
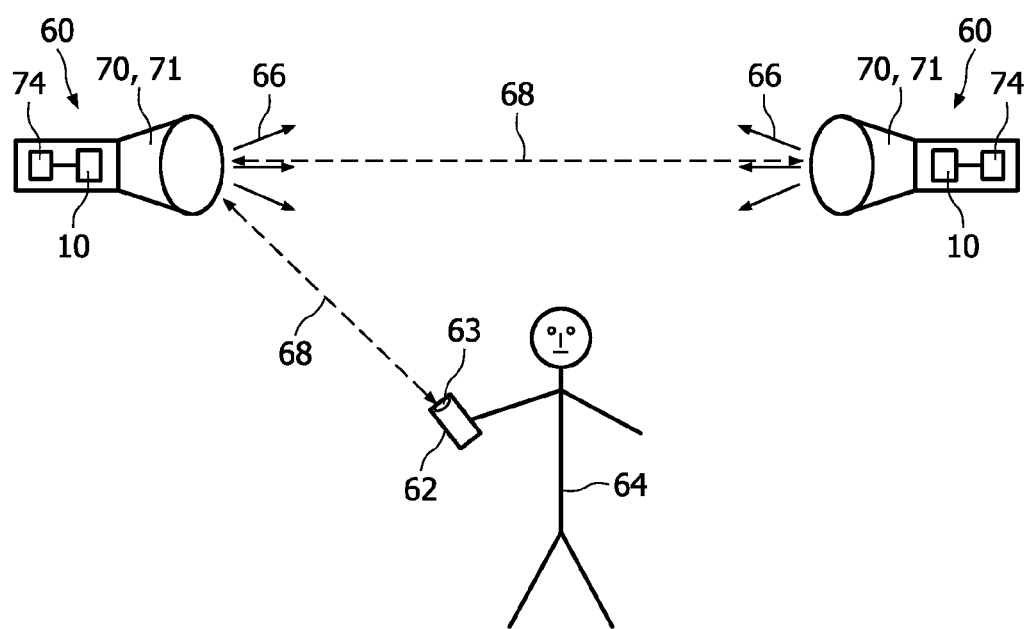
FIG. 7 shows an illustrative example of a lighting system incorporating the inventive light sensor device.

In FIG. 7, an application example of the light sensor device 10, particularly that shown in FIG. 6, is schematically illustrated. The light sensor device 10 is incorporated into a lamp 60 which is part of a lighting system comprising a plurality of such lamps 60.

Each lamp 60 comprises a light source 70, preferably one or more light emitting diodes. Of course, organic light emitting diodes, poly light emitting diodes or any other type of light source may be used instead.

The light source 70 is controlled and driven by a control circuit 74 which in turn is connected to the light sensor device 10 as described above.

In addition to the lamps 60, the lighting system comprises a remote control 62 which comprises at least one infrared LED 63 for transmitting data signals via a data link 68 to any of the lamps 60. The remote control 62 is used by a user 64.

The data link 68 may be built up between the remote control 62 and any of the lamps 60, wherein the light sensitive area 13 for detecting the infrared light spectrum is provided for receiving the data signals from the remote control 62. Such data signals are processed by the control circuit 74. The user 64 may, for example, switch on and off the light source of the lamp 60, may adjust the light intensity of the light source, or may adjust its color.

Since the light sensor device 10 comprises an infrared transmitting device 50, the lamp 60 is able to establish a further data link to an adjacent lamp 60. This data link 68 may be used for transmitting control signals between adjacent lamps 60 in both directions. The bidirectionality is achieved by providing said infrared transmitting device 50 as well as the light sensitive area 13, which is sensitive to infrared light, within the light sensor device 10.

The light sensitive areas 15a, 15b, 15c of the light sensor device 10 are used to sense the respective light spectrum, so that the control circuit 74 may adjust the RGB light sources in order to reach the desired lamp settings. As already mentioned before, these desired lamp settings may be sent by a user via the remote control 62 or by another lamp 60.

For example, after switching one of the lamps 60 on, this lamp sends an infrared identification signal which is received by the second lamp 60. As a result, a self-configuring two-way communication link 68 is established, whereas one of those lamps acts as the master and the other lamp as the slave. After establishing the infrared link, the master forces the slave to adjust its light condition to the condition of the master. This guarantees that each lamp of a room has the same light output unless the user interrupts the master slave link and sets each lamp condition manually by means of the remote control 62.

The application shown in FIG. 7 may be extended by an additional control unit (not shown) which comprises a light sensor device 10 and a control circuit 74, but no light source. This additional control unit can be used to measure the color at a specific location and to send respective control signals to adjacent lamps 60. Further, the additional unit may receive control signals from a remote control.

To sum up, the present invention provides a novel color sensor device with infrared communication link. The light sensor device includes adapted filter arrangements in order to realize the required spectral sensitivity in the visible light area and in addition a filter arrangement adapted to the infrared region. All necessary filter arrangements as well as the sensitive semiconductor structures are combined in one sensor component. As a result, the sensor can be used to capture the actual color spectrum of the lamp and at the same time to receive infrared signals sent from other light sources or remote control devices.

In a special embodiment, the combined color and infrared sensor is extended by means of an infrared transmitting device. This allows the sensor device to also transmit required information to other light sources or remote control devices.

The proposed color feedback sensor with combined infrared communication means helps to reduce the size of the sensor part of solid state light sources (mounting and wiring of only one combined module instead of separate light sensors, an infrared receiver and an infrared transmitter), which also results in simpler and cheaper products and allows for wireless communication links between lamps and remote control devices.

The invention claimed is:

1. A light sensor device comprising
a substrate,
a first light sensitive area,
a second light sensitive area,
a first optical filter device assigned to said first area and adapted to filter the visible light spectrum,
a second optical filter device assigned to said second area and adapted to filter the non-visible light spectrum, and
an infrared light emitting diode disposed on the substrate for transmitting information and/or control signals via infrared light, wherein said first and second light sensitive areas and said infrared light emitting diode are fabricated on the same substrate adjacent to each other to form a single integrated sensor component;
wherein said first and second light sensitive areas are provided within a single window recessed in the substrate and said first and second filter devices are arranged above said window, and immediately adjacent to each other, to optically seal the recessed window.

2. The light sensor device of claim 1, wherein both light sensitive areas are sensitive to visible light and infrared light and said non-visible light spectrum is an infrared light spectrum.

3. The light sensor device of claim 1, wherein at least one of said light sensitive areas is provided as at least one PIN diode.

4. The light sensor device of claim 1, wherein said first area comprises three sensitive regions, each region is assigned an optical filter device for separating the visible light spectrum in three sub-spectra.

5. The light sensor device of claim 4, wherein said optical filter devices are adapted to filter red, green and blue light.

6. The light sensor device of claim 1, wherein at least one of said sensitive areas is coupled with at least one amplifier stage for amplifying the output of said sensitive area.

7. The light sensor device of claim 6, wherein an output of at least one of said amplifier stages is coupled to filter means.

8. The light sensor device of claim 1, wherein an infrared light emitting diode is driven by a controller circuit for transmitting said information and/or control signals.

* * * * *